United States Patent
Lee et al.

(10) Patent No.: US 8,064,247 B2
(45) Date of Patent: Nov. 22, 2011

(54) REWRITABLE MEMORY DEVICE BASED ON SEGREGATION/RE-ABSORPTION

(75) Inventors: Ming-Hsiu Lee, Hsinchu (TW); Chieh-Fang Chen, Banciao (TW); Yen-Hao Shih, Elmsford, NY (US); Yu Zhu, West Harrison, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 181 days.

(21) Appl. No.: 12/488,795

(22) Filed: Jun. 22, 2009

(65) Prior Publication Data

US 2010/0177553 A1 Jul. 15, 2010

Related U.S. Application Data

(60) Provisional application No. 61/144,692, filed on Jan. 14, 2009.

(51) Int. Cl.
*G11C 11/00* (2006.01)
(52) U.S. Cl. .................................................. 365/163
(58) Field of Classification Search .................. 365/145, 365/148, 163
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 3,846,767 A | 11/1974 | Cohen |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |

(Continued)

FOREIGN PATENT DOCUMENTS

WO 2004025659 A1 3/2004

OTHER PUBLICATIONS

"Magnetic Bit Boost," www.sciencenews.org, Dec. 18 & 25, 2004, p. 389, vol. 166.

(Continued)

*Primary Examiner* — VanThu Nguyen
(74) *Attorney, Agent, or Firm* — Haynes Beffel & Wolfeld LLP

(57) ABSTRACT

Memory devices described herein are programmed and erased by physical segregation of an electrically insulating layer out of a memory material to establish a high resistance state, and by re-absorption of at least a portion of the electrically insulating layer into the memory material to establish a low resistance state. The physical mechanism of programming and erasing includes movement of structure vacancies to form voids, and/or segregation of doping material and bulk material, to create the electrically insulating layer consisting of voids and/or dielectric doping material along an interelectrode current path between electrodes.

26 Claims, 16 Drawing Sheets

U.S. PATENT DOCUMENTS

| | | | |
|---|---|---|---|
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,075,719 A | 6/2000 | Lowrey et al. | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,337,266 B1 | 1/2002 | Zahorik | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,106 B1 | 11/2002 | Kozicki | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,512,263 B1 | 1/2003 | Yuan et al. | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,815,704 B1 | 11/2004 | Chen | |
| 6,838,692 B1 | 1/2005 | Lung et al. | |
| 6,850,432 B2 | 2/2005 | Lu et al. | |
| 6,859,389 B2 | 2/2005 | Idehara | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen | |
| 6,998,289 B2 | 2/2006 | Hudgens et al. | |
| 7,023,008 B1 | 4/2006 | Happ | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,085,154 B2 | 8/2006 | Cho et al. | |
| 7,099,180 B1 | 8/2006 | Dodge et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,126,847 B2 | 10/2006 | Ha et al. | |
| 7,132,675 B2 | 11/2006 | Gilton | |
| 7,151,273 B2 | 12/2006 | Campbell et al. | |
| 7,154,774 B2 | 12/2006 | Bedeschi et al. | |
| 7,158,411 B2 | 1/2007 | Yeh et al. | |
| 7,164,147 B2 | 1/2007 | Lee et al. | |
| 7,166,533 B2 | 1/2007 | Happ | |
| 7,169,635 B2 | 1/2007 | Kozicki | |

| Patent/Pub No. | Date | Inventor |
|---|---|---|
| 7,190,607 B2 | 3/2007 | Cho et al. |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,505,330 B2 | 3/2009 | Pawlowski et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,569,844 B2 | 8/2009 | Lung |
| 7,826,248 B2 * | 11/2010 | Xi et al. .................. 365/148 |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0018156 A1 | 1/2006 | Happ |
| 2006/0034112 A1 | 2/2006 | Oh et al. |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0140029 A1 | 6/2007 | Kim et al. |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |

| | | |
|---|---|---|
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166603 A1 | 7/2009 | Lung |
| 2009/0268507 A1 | 10/2009 | Breitwisch et al. |
| 2009/0273968 A1 | 11/2009 | Lamorey et al. |
| 2009/0289242 A1 | 11/2009 | Breitwisch et al. |
| 2009/0294748 A1 | 12/2009 | Breitwisch et al. |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published at least as early as Dec. 1997, pp. 1-6.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Intl Symp on VLSI Technology, Systems and Applications, Apr. 23-25, 2007, pp. 1-2.
Chen, AN et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.
Czubatyj et al., "Current Reduction in Ovonic Memory Devices", E*PCOS06 May 29-31, 2006, Grenoble, France, 10 pages.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004 pp. 28-29 and workshop cover sheet.
Kim, Kinam et al., "Reliability Investigations for Manufacturable High Density PRAM," IEEE 43rd Annual International Reliability Physics Symposium, San Jose, Apr. 17-21, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM Dec. 13-15, 2004, 4 pp.
Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Lee et al., "Separate domain formation in Ge2Sb2Te5—SiOx mixed layer", Applied Physics Letters, Oct. 2006, vol. 89 Issue:16, 3 pages.

Lee, Ming-Hsiu, et al. "A Study of Current Direction Dependent Cycling Failure of Phase Change Memory," Presented at the 2009 Symp. on VLSI Technology, Jun. 15-18, 2009, Kyoto Japan, 2 pages.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Noh et al., "Modification of Ge2Sb2Te5 by the Addition of SiOx for Improved Operation of Phase Change Random Access Memory", Mater. Res. Soc. Symp. Proc. 888 v5 6 pages at least as early as 2006 (meeting held in fall 2005).

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Ryu, et al., "SiO2 Incorporation Effects in Ge2Sb2Te5 Films Prepared by Magnetron Sputtering for Phase Change Random Access Memory Devices," Electrochemical and Solid-State Letters 9(8) G259-G261 May 23, 2006.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

See Wikipedia, Segregation in materials, http://en.wikipedia.org/wiki/Segregation_in_materials (as of Jan. 6, 2009, 18:01 GMT), 7 pages.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='non-volatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

REWRITABLE MEMORY DEVICE BASED ON SEGREGATION/RE-ABSORPTION

CROSS-REFERENCE TO RELATED APPLICATIONS

This application claims the benefit of U.S. Provisional Patent Application No. 61/144,692 titled "Rewritable Memory Device" filed on 14 Jan. 2009, which is incorporated by reference herein.

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to programmable resistance memory devices, and methods for operating such devices.

2. Description of Related Art

Many electronic systems need a nonvolatile memory having very long retention times at high temperature, and yet are also rewritable for updating codes and data stored therein. However, not many memory cell technologies can satisfy both of these requirements.

Phase change based memory materials, like chalcogenide based materials and similar materials, can be caused to change phase between an amorphous and a crystalline phase by application of electrical current at levels suitable for implementation in integrated circuits.

In conventional phase change memory, data is stored by the application of current which heats the phase change material to cause a transition of an active region between amorphous and crystalline phases. Because the phase change occurs as a direct result of heating, memory cells having phase change memory elements can suffer drift in resistance, as the active region composition shifts from amorphous to crystalline phase, or vice versa, due to environmental conditions to which the device is exposed.

For example, a phase change memory cell in which the active region has been reset to a generally amorphous state may over time develop a distribution of crystalline regions in the active region. If these crystalline regions connect to form a low resistance path through the active region, when the memory cell is read a lower resistance state will be detected and result in a data error. See, Gleixner, "Phase Change Memory Reliability", 22nd NVSMW, 2007. Similar issues can arise in other types of programmable resistance materials.

It is therefore desirable to provide programmable resistance memory cells and methods for operating such devices which address the data retention issues discussed above.

SUMMARY OF THE INVENTION

Memory devices described herein are programmed and erased by physical segregation of an electrically insulating layer out of a memory material to establish a high resistance state, and by re-absorption of at least a portion of the electrically insulating layer into the memory material to establish a low resistance state.

The physical mechanism of programming and erasing includes movement of structure vacancies to form voids, and/or segregation of doping material and bulk material, to create the electrically insulating layer consisting of voids and/or dielectric doping material along an inter-electrode current path between electrodes. In embodiments the electrically insulating layer may be formed at the interface with one of the electrodes.

In embodiments the segregation and re-absorption of the electrically insulating layer as described herein can be due to kinetic mechanisms which depend on the polarity of the electric field, temperature gradients, and/or current density distribution. For example, the segregation to form the electrically insulating layer can be due to movement of material of the electrically insulating layer from regions of lower current density within the body of memory material to regions of higher current density, from regions of lower temperature to regions of higher temperature, from regions of lower voltage potential to regions of higher voltage potential, and/or other kinetic processes.

Since the memory mechanism described herein is a kinetic process under electrical bias, rather than due to changes in the solid phase conditions in the memory material, the memory devices described herein provide good immunity to environmental conditions to which the device is exposed and thus have improved data retention.

A memory device as described herein includes a memory cell comprising a body of memory material between first and second electrodes. The memory device further includes circuitry to apply bias arrangements to the memory cell to establish high and low resistance states in the memory cell. A first bias arrangement provides a sufficient amount of energy to the memory material to induce the segregation of the electrically insulating layer out of the body of memory material to establish the high resistance state. A second bias arrangement provides a sufficient amount of energy to the memory material to induce re-absorption of at least a portion of the electrically insulating layer into the body of memory material to establish the low resistance state.

In embodiments the second bias arrangement may have opposite polarity to that of the first bias arrangement, to enhance electromigration and other kinetic processes that are dependent upon the direction of the applied electric field and/or current.

In embodiments the contact surface between the first electrode and the body of memory material can be less than the contact surface between the second electrode and the body of memory material, to facilitate asymmetrical segregation/re-absorption processes described herein.

The kinetic memory mechanism has been demonstrated herein for a memory device having a body of memory material comprising silicon oxide doped $Ge_xSb_yTe_z$, where x=2, y=2 and z=5, doped with 10 to 20 atomic % silicon oxide. However, since the memory mechanism described herein does not rely on changes in the solid phase conditions in the memory material, other materials which are characterized by segregation and re-absorption kinetic processes of an electrically insulating layer as a result of the application of programming and erasing bias arrangements may be utilized.

In embodiments the memory material may comprise a doped or undoped metal, semiconductor or metal/semiconductor alloy that contains structural vacancies, doping, or both. The doping can comprise one or both of dielectric and gas type doping materials. In the doped embodiments, the electrically insulating layer forms as a result of the segregation of at least some of the doping materials.

Methods for operating memory devices as described above are also disclosed herein.

Other aspects and advantages of the present invention can be seen on review of the drawings, the detailed description, and the claims which follow.

DETAILED DESCRIPTION

A detailed description of embodiments of the present invention is provided with reference to the FIGS. 1-21.

Figure 1:
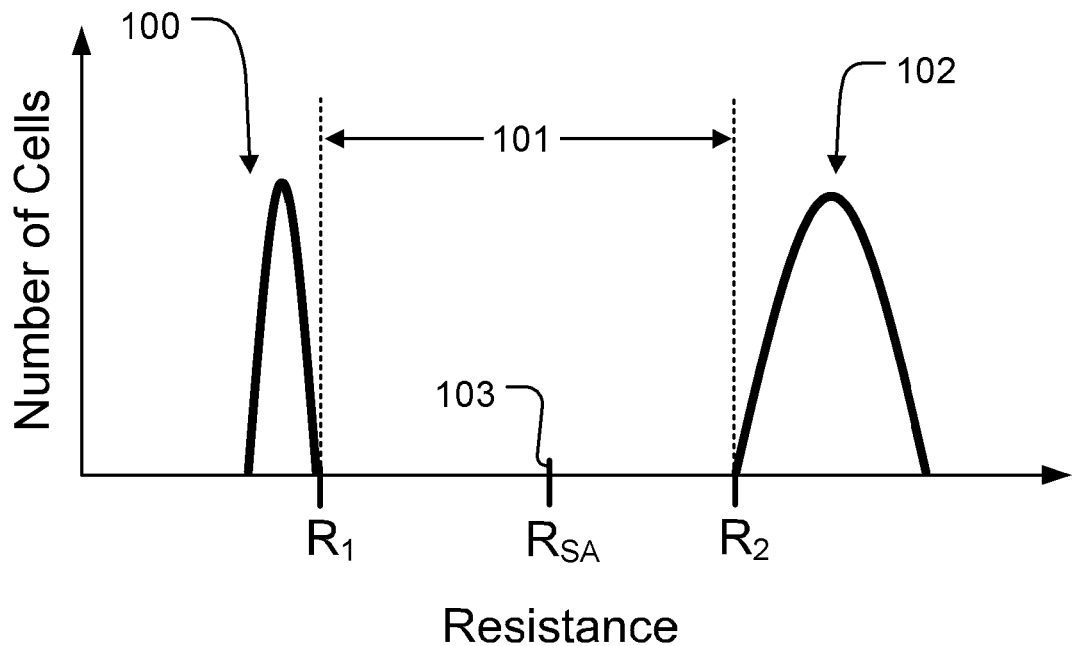
FIG. 1 is a graph of resistance distribution for memory states in memory cells storing a single bit of data.

In conventional phase change memory, data is stored by causing transitions in an active region of the phase change material between amorphous and crystalline phases, which have significantly different resistances. FIG. 1 is a graph of resistance distribution for memory states in memory cells storing a single bit of data, including a lower resistance set (programmed) state 100 corresponding to a primarily crystalline phase in the active region of the cell, and a high resistance reset (erased) state 102 corresponding to a primarily amorphous phase in the active region of the cell. For reliable operation, the resistance distributions must have non-overlapping resistance ranges.

The difference between the highest resistance $R_1$ of the lower resistance state 100 and the lower resistance $R_2$ of the high resistance reset state 102 defines a read margin 101 used to distinguish cells in the lower resistance state 100 from those in the high resistance state 102. The data stored in a memory cell can be determined by determining whether the memory cell has a resistance corresponding to the lower resistance state 100 or to the high resistance state 102, for example by measuring whether the resistance of the memory cell is above or below a threshold resistance value RSA 103 within the read margin 101. In multiple bit per cell embodiments, there are more than two resistance states, with read margins between them.

In order to reliably distinguish between the reset state 102 and the set state 100, it is important to maintain a relatively large read margin 101. However, it has been observed that some phase change memory cells in the reset state 102 can experience drift by which the resistance of the memory cell decreases over time to below the threshold resistance value RSA 103, resulting in data retention problems and bit errors for those memory cells.

Figure 2:
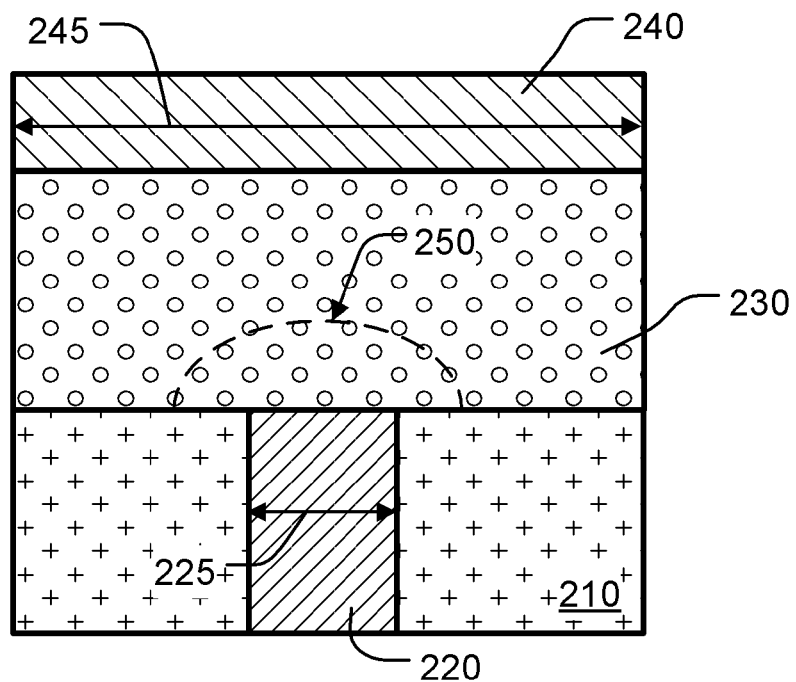
FIG. 2 illustrates a cross-sectional view of a prior art "mushroom-type" memory cell.

FIG. 2 illustrates a cross-sectional view of a prior art "mushroom-type" memory cell 200 having a bottom electrode 220 extending through a dielectric layer 210, a phase change memory element 230 comprising a layer of phase change material on the bottom electrode 220, and a top electrode 240 on the phase change material 230. As can be seen in FIG. 2, the bottom electrode 220 has a width 225 less than the width 245 of the top electrode 240 and phase change material 230.

In operation, voltages on the top and bottom electrodes 240, 220 induce a current to flow from the top electrode 240 to the bottom electrode 220, or vice-versa, via the phase change memory element 230.

The active region 250 is the region of the phase change memory element 230 in which the phase change material is induced to change between at least two solid phases. Due to the differences in the widths 225 and 245, in operation the current density is concentrated in the region of the phase change memory element 230 adjacent the bottom electrode 220, resulting in the active region 250 having a "mushroom" shape as shown in FIG. 2.

The change from the high resistance state 102 to the lower resistance state 100 is generally a lower current operation in which current heats the phase change material above the transition temperature to cause transition of the active region 250 from the amorphous to the crystalline phase. The change from the lower resistance state 100 to the higher resistance state 102 is generally a higher current operation, which includes a short high current density pulse to melt or breakdown the crystalline structure, after which the phase change material cools quickly, quenching the phase change process and allowing the active region 250 to stabilize in the amorphous phase.

In the high resistance state 102, the memory element 230 has a generally amorphous active region 250 and a random distribution of crystalline regions within the active region 250. Over time and exposure to elevated temperatures the crystalline regions will experience growth. If these crystalline regions connect to form a low resistance path through the active region 250, when the memory cell is read a lower resistance state will be detected and result in a data error.

Figure 3A:
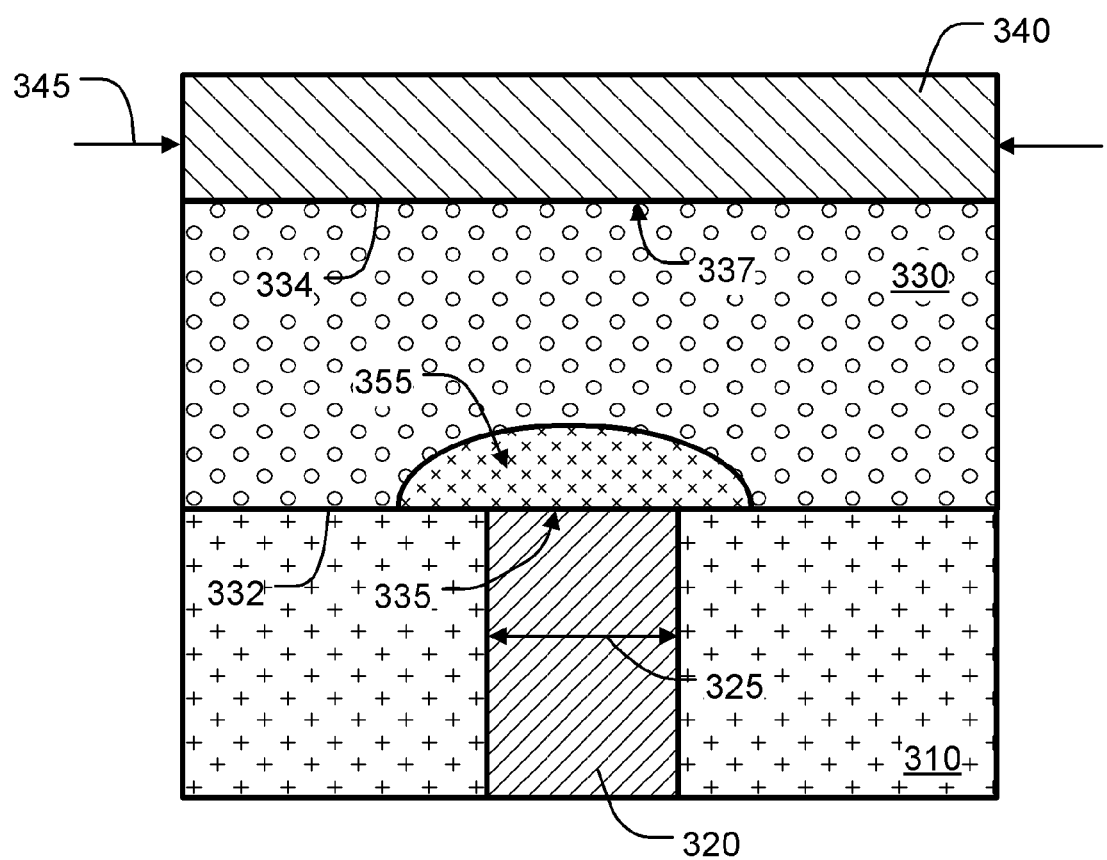
FIGS. 3A-3B illustrate a first embodiment of a memory cell programmed and erased as described herein by the segregation and re-absorption of an electrically insulating layer within a body of memory material.
Figure 3B:
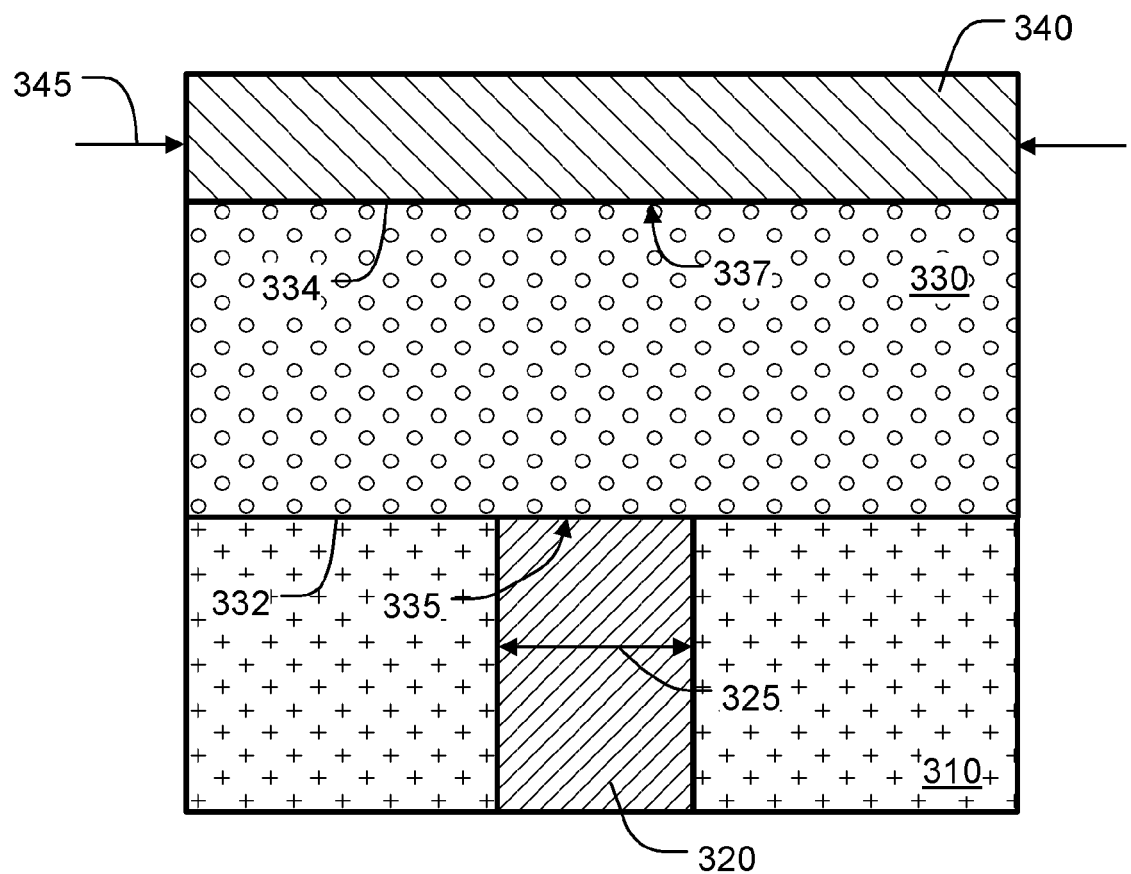

FIGS. 3A-3B illustrate cross-sectional views of a first embodiment of a memory cell 300 programmed and erased as described herein by the segregation and re-absorption of an electrically insulating layer 355 within a body of memory material of memory element 330.

The memory cell 300 includes a first electrode 320 contacting the bottom surface 332 of memory element 330 at a first contact surface 335. The first electrode 320 may comprise, for example, TiN or TaN. Alternatively, the first electrode 320 may be W, WN, TiAlN or TaAlN, or comprise, for further examples, one or more elements selected from the group consisting of doped-Si, Si, Ge, C, Ge, Cr, Ti, W, Mo, Al, Ta, Cu, Pt, Ir, La, Ni, N, O, and Ru and combinations thereof.

The first electrode 320 extends through dielectric 310 to couple the memory element to underlying access circuitry (not shown). The dielectric 310 may comprise, for example, silicon oxide. Alternatively, the dielectric 310 may comprise other dielectric materials.

The memory cell 300 includes a second electrode 340 contacting the top surface 334 of the memory element 330 at a second contact surface 337 having a surface area greater than that of the first contact surface 335. The second electrode 340 may comprise, for example, any of the materials discussed above with reference to the first electrode 320.

As can be seen in the Figures, the width 325 of the first electrode 320 is less than the width 345 of the memory element 330 and second electrode 340, and thus current is concentrated in the portion of the memory element 330 adjacent the first electrode 320.

The memory material of memory element 330 in this example comprises $Ge_2Sb_2Te_5$ material doped with 10 to 20 atomic percent (at %) silicon oxide. Other materials which are characterized by segregation and re-absorption kinetic processes of an electrically insulating layer 355 as a result of the application of programming and erasing bias arrangements may be used as well. In embodiments the memory material 330 may comprise a doped or undoped metal, semiconductor or metal/semiconductor alloy that contains structural vacancies, doping, or both. The doping can comprise one or both of dielectric and gas type doping materials.

Reading or writing to the memory cell 300 can be achieved by applying appropriate bias arrangements across the memory element 330. The bias arrangements comprise applying pulses to one or both of the first and second electrodes 320, 340 to induce current through the memory element 330. The levels and durations applied are dependent upon the operation performed (e.g. a read operation, a program operation, an erase operation) and can be determined empirically for each embodiment. The bias arrangements may include pulses having a positive voltage from the first electrode 320 to the second electrode 340, and/or may include a negative voltage from the first electrode 320 to the second electrode 340.

FIG. 3A illustrates heuristically, the memory cell 300 in the high resistance state. In a program operation of the memory cell 300, bias circuitry (See, for example bias circuitry voltage and current sources 1036 of FIG. 10 with the accompanying controller 1034) coupled to the first and second electrodes 320, 340 induces a current to flow between the first and second electrodes 320, 340 via the memory element 330 sufficient to induce segregation of the electrically insulating layer 355 out of the memory material 330 by movement of structural vacancies to form voids, and/or segregation of doping materials and bulk material, creating the electrically insulating layer 355 consisting of doping materials and/or voids at the first contact surface 335.

The electrically insulating layer 355 establishes a high resistance state in the memory cell 300.

FIG. 3B illustrates heuristically, the memory cell 300 in the low resistance state. In an erase operation of the memory cell 300, bias circuitry coupled to the first and second electrodes 320, 340 induces a current to flow between the first and second electrodes 320, 340 via the memory element 330 to induce re-absorption of the voids and/or doping materials from the electrically insulating layer 355, into the bulk memory material 330 to establish a low resistance state in the memory cell 300. In the illustration of FIG. 3B the electrically insulating layer 355 is not shown as it has been completely re-absorbed to establish the low resistance state. More generally, the low resistance state can established by absorption of at least a portion of the electrically insulating layer 355.

The memory cell 300 may also be programmed to one or more intermediate resistance states between the high and low resistance states by application of appropriate bias arrangements.

As discussed above, the memory cell 300 is programmed by the physical segregation of an electrically insulating layer 355 out of a memory material 330 to establish a high resistance state, and by re-absorption of at least a portion of the electrically insulating layer 355 into the memory material 330 to establish a low resistance state. Thus the memory mechanism is a kinetic process under electrical bias, rather than due to changes in the solid phase conditions in the memory material. As a result, the memory devices described herein have good immunity to environmental conditions to which the device is exposed and thus have improved data retention.

In embodiments the segregation to form the electrically insulating layer can be due to movement of material of the electrically insulating layer from regions of lower current density within the body of memory material to regions of higher current density, from regions of lower temperature to regions of higher temperature, from regions of lower voltage potential to regions of higher voltage potential, and/or other kinetic processes.

Figure 4:
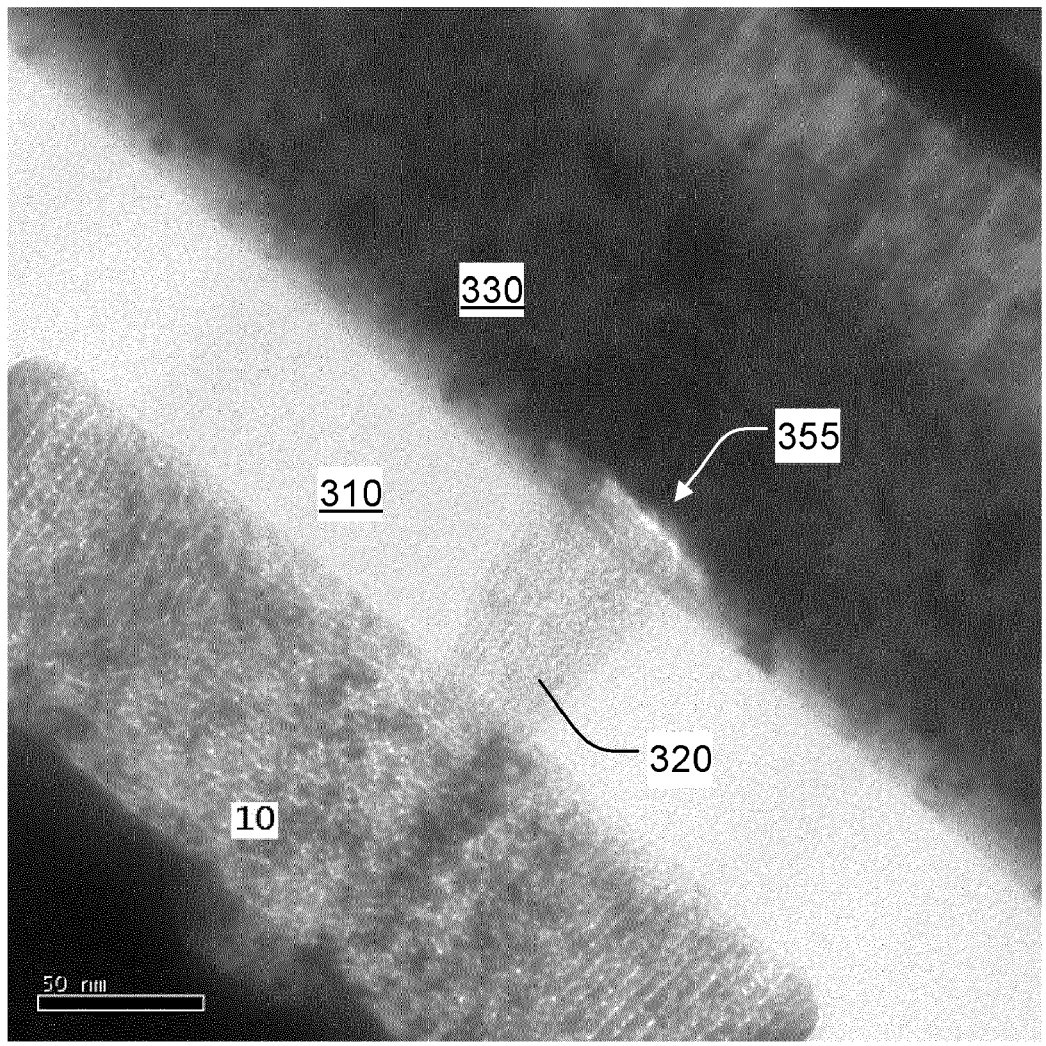
FIG. 4 is a transmission electron microscope (TEM) photograph of a memory cell as described herein showing an electrically insulating layer at the interface with an electrode.

FIG. 4 is a transmission electron microscope (TEM) photograph of a memory cell in the high resistance state as described herein, only showing a first electrode 320 with a 50 nm diameter contact surface, an electrically insulating layer 355, and bulk memory material 330. The bulk memory material 330 in this example is GST doped with 15 atomic percent silicon oxide formed on the first electrode 320 of titanium nitride. The photograph illustrates clear segregation of materials to form the electrically insulating layer 355. The electrically insulating layer 355 is reversible as described below, by applying a bias arrangement under which at least a portion of the electrically insulating layer 355 is re-absorbed into the bulk memory material 330.

Figure 5:
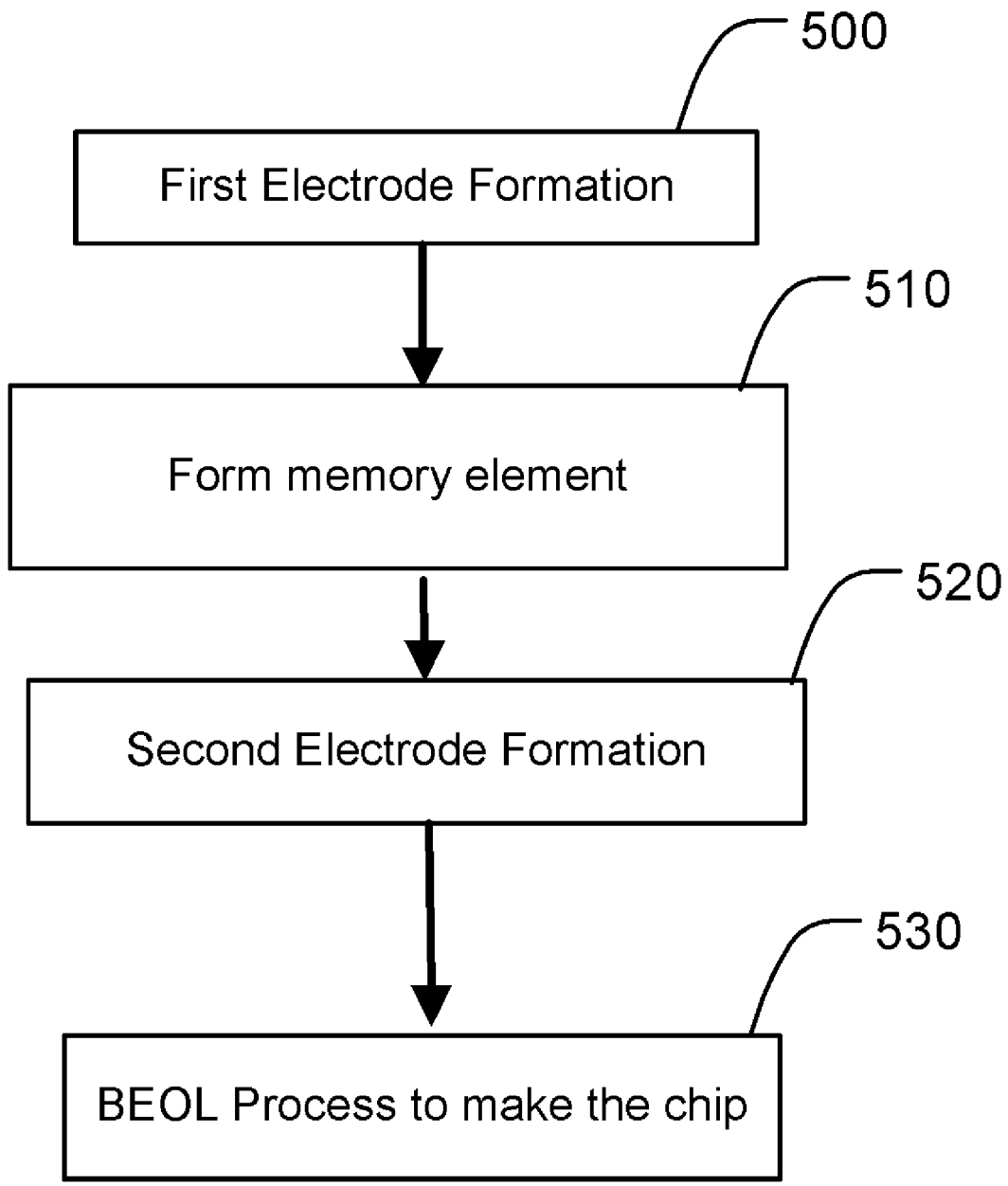
FIG. 5 is a simplified flowchart of a manufacturing process described herein.
Figure 6A:
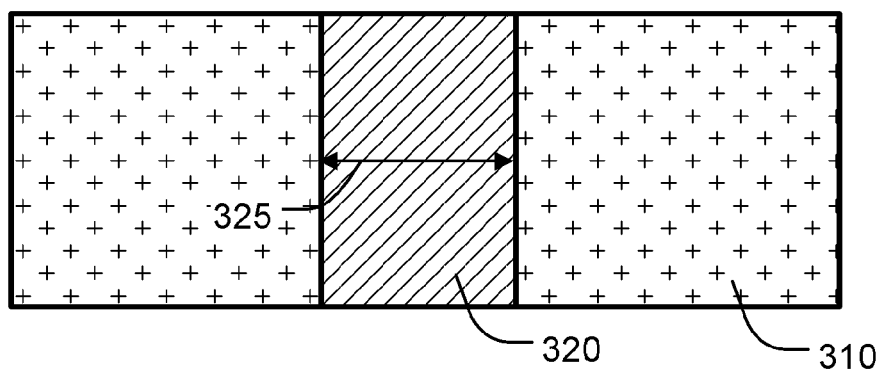
FIGS. 6A-6C illustrate stages of a manufacturing process for the formation of a memory cell as described herein.
Figure 6B:
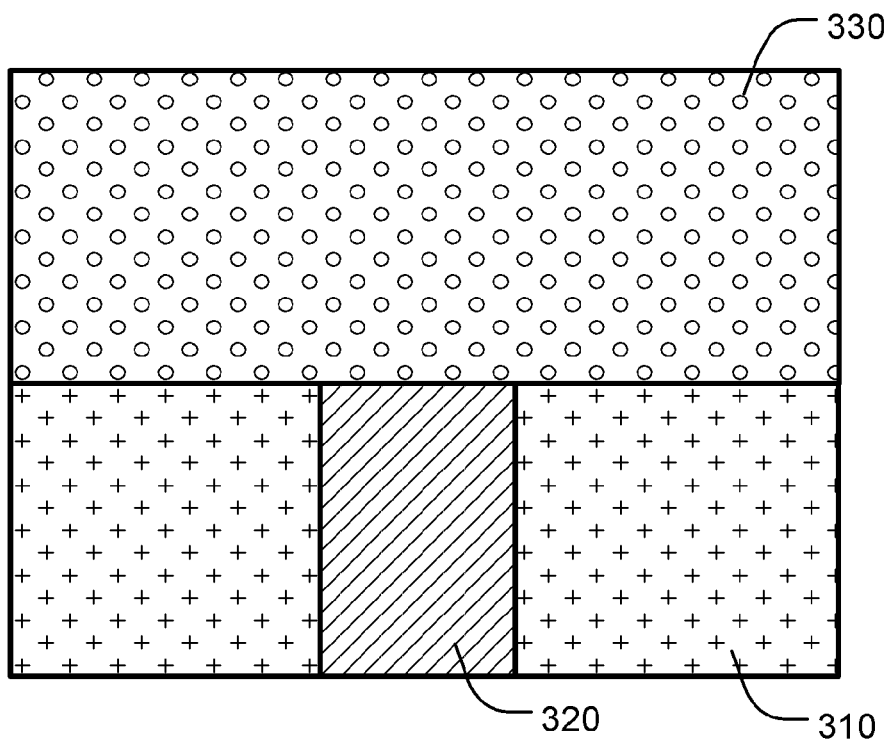
Figure 6C:
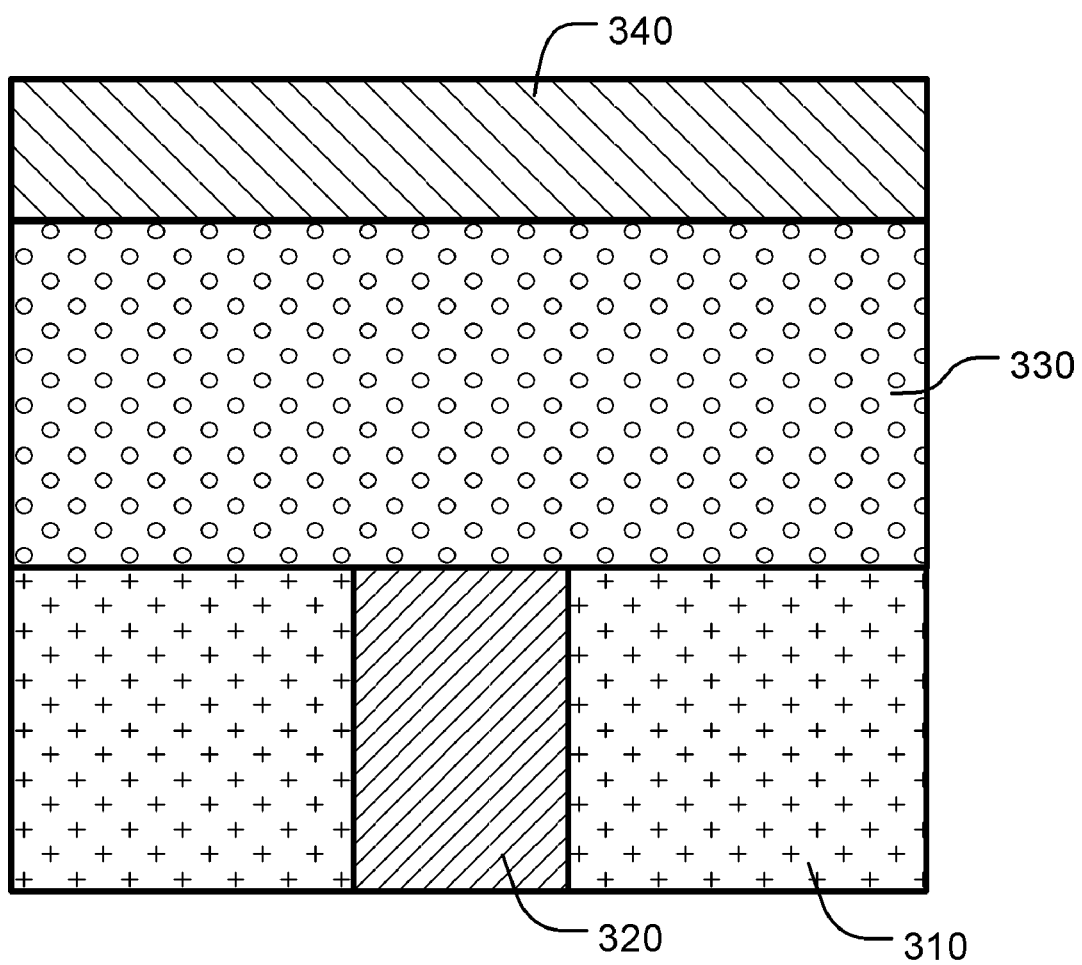

FIG. 5 illustrates a simplified process flow diagram and FIGS. 6A-6C illustrate stages in a manufacturing process for manufacturing the memory cell 300 of FIGS. 3A-3B.

At step 500 the first electrode 320 having a width or diameter 325 is formed extending through dielectric 310, resulting in the structure illustrated in the cross-sectional view of FIG. 6A. In the illustrated embodiment the first electrode 320 comprises TiN and the dielectric 310 comprises SiN. In some embodiments the first electrode 30 has a sublithographic width or diameter 325.

The first electrode 320 extends through dielectric 310 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode 320 and the dielectric layer 310 can be formed, for example, by forming a layer of electrode material on the top surface of access circuitry (not shown), followed by patterning of a layer of photoresist on the electrode layer using standard photo lithographic techniques so as to form a mask of photoresist overlying the location of the first electrode 320. Next the mask of photoresist is trimmed, using for example oxygen plasma, to form a mask structure having sublithographic dimensions overlying the location of the first electrode 320. Then the layer of electrode material is etched using the trimmed mask of photoresist, thereby forming the first electrode 320 having a sublithographic diameter 325. Next dielectric material 310 is formed and planarized, resulting in the structure illustrated in FIG. 6A.

As another example, the first electrode 320 and dielectric 310 can be formed by forming the dielectric 310 on the top surface of access circuitry, followed by sequentially forming an isolation layer and a sacrificial layer. Next, a mask having openings close to or equal to the minimum feature size of the process used to create the mask is formed on the sacrificial layer, the openings overlying the location of the first electrode 320. The isolation layer and the sacrificial layers are then selectively etched using the mask, thereby forming a via in the isolation and sacrificial layers and exposing a top surface of the dielectric layer 310. After removal of the mask, a selective undercutting etch is performed on the via such that the isolation layer is etched while leaving the sacrificial layer and the dielectric layer 310 intact. A fill material is then formed in the via, which due to the selective undercutting etch process results in a self-aligned void in the fill material being formed within the via. Next, an anisotropic etching process is performed on the fill material to open the void, and etching continues until the dielectric layer 310 is exposed in the region below the void, thereby forming a sidewall spacer comprising fill material within the via. The sidewall spacer has an opening dimension substantially determined by the dimensions of the void, and thus can be less than the minimum feature size of a lithographic process. Next, the dielectric layer 310 is etched using the sidewall spacers as an etch mask, thereby forming an opening in the dielectric layer 310 having a diameter less than the minimum lithographic feature size. Next, an electrode layer is formed within the openings in the dielectric layer 310. A planarizing process, such as chemical mechanical polishing CMP, is then performed to remove the isolation layer and the sacrificial layer and to form the first electrode 320, resulting in the structure illustrated in FIG. 6A.

At step 510 a body of memory material 330 (e.g. doped $Ge_2Sb_2Te_5$ material having 10 to 20 at % silicon oxide) is deposited on the first electrode 320 and dielectric 310 of FIG. 6A, resulting in the structure illustrated in FIG. 6B. The deposition of $Ge_2Sb_2Te_5$ and silicon oxide may be carried out by co-sputtering of a GST target with for one example, a DC power of 10 Watts and a SiO2 target with an RF power of 10 to 115 Watts in an argon atmosphere.

An optional annealing (not shown) can be performed to crystallize the memory material in some embodiments. In the illustrated embodiment the thermal annealing step is carried out at 300 degrees C. for 100 seconds in a nitrogen ambient. Alternatively, since subsequent back-end-of-line processes performed to complete the device may include high temperature cycles and or a thermal annealing step depending upon the manufacturing techniques used to complete the device, in some embodiments the annealing may accomplished by following processes, and no separate annealing step is added to the manufacturing line.

Next, at step 520 second electrode 340 is formed, resulting in the structure illustrated in FIG. 6C. The second electrode and memory material layers may be patterned as needed for a given implementation. In the illustrated embodiment the second electrode 340 comprises TiN.

Figure 10:
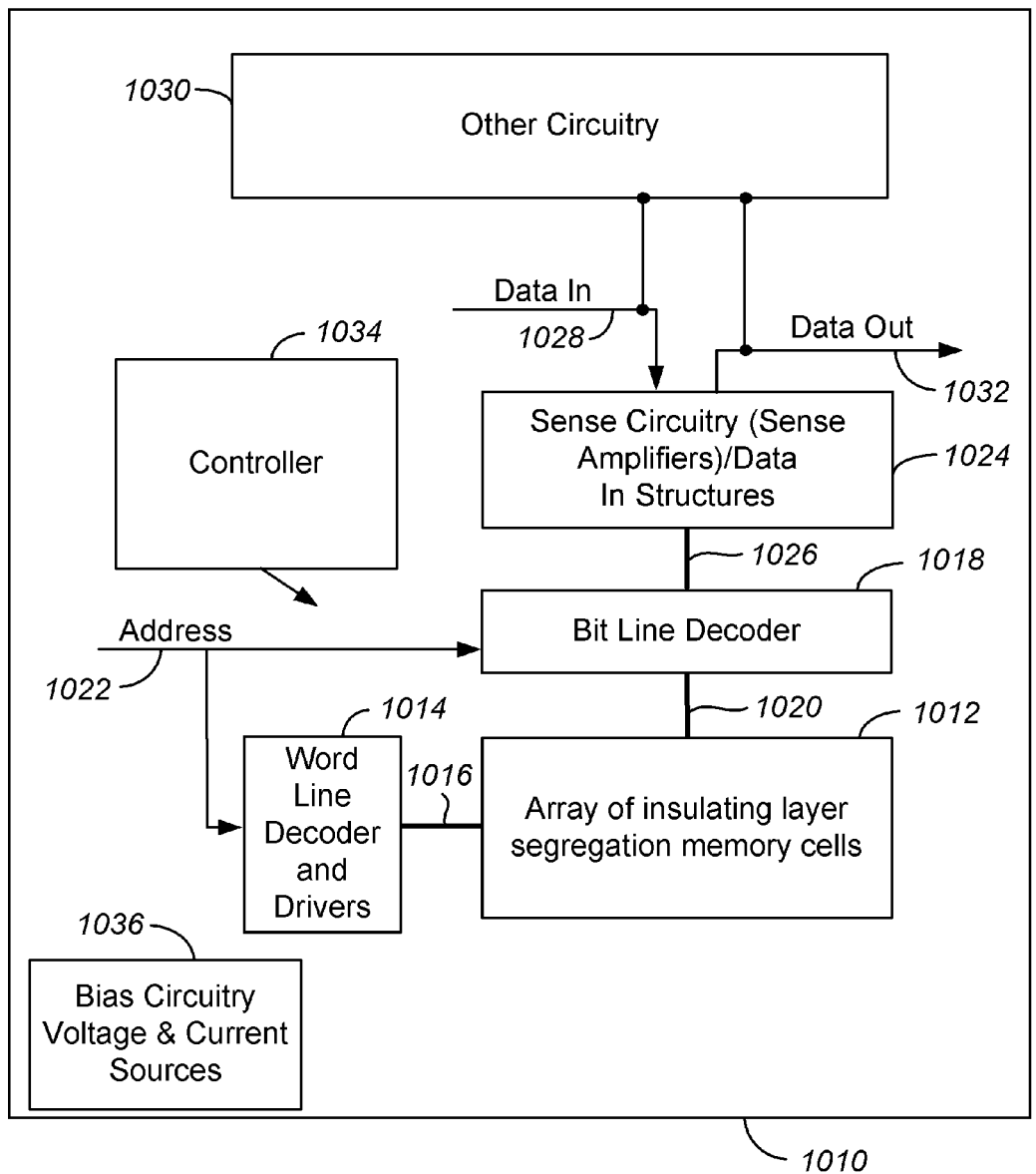
FIG. 10 is a simplified block diagram of an integrated circuit including a memory array implemented using memory cells based on electrical insulating layer segregation and re-absorption, as described herein.

Next, at step 530 back-end-of-line (BEOL) processing is performed to complete the semiconductor process steps of the chip. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to periphery circuitry. These BEOL processes may include deposition of dielectric material at elevated temperatures, such as depositing SiN at 400 degrees C. or high density plasma HDP oxide deposition at temperatures of 500 degrees C. or greater. As a result of these processes, control circuits and biasing circuits as shown in FIG. 10 are formed on the device.

Figure 7:
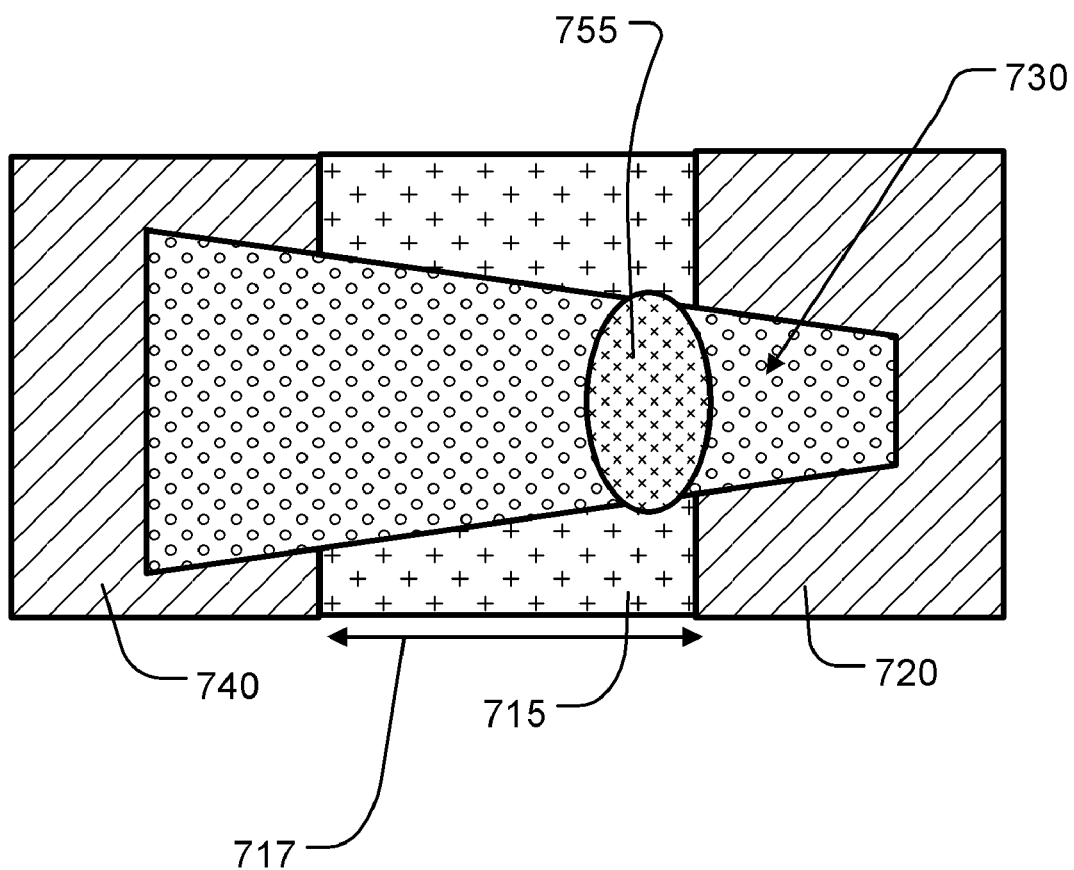
FIG. 7 illustrates a top view of a second memory cell having an electrically insulating layer within a body of memory material in the programmed state.
Figure 8:
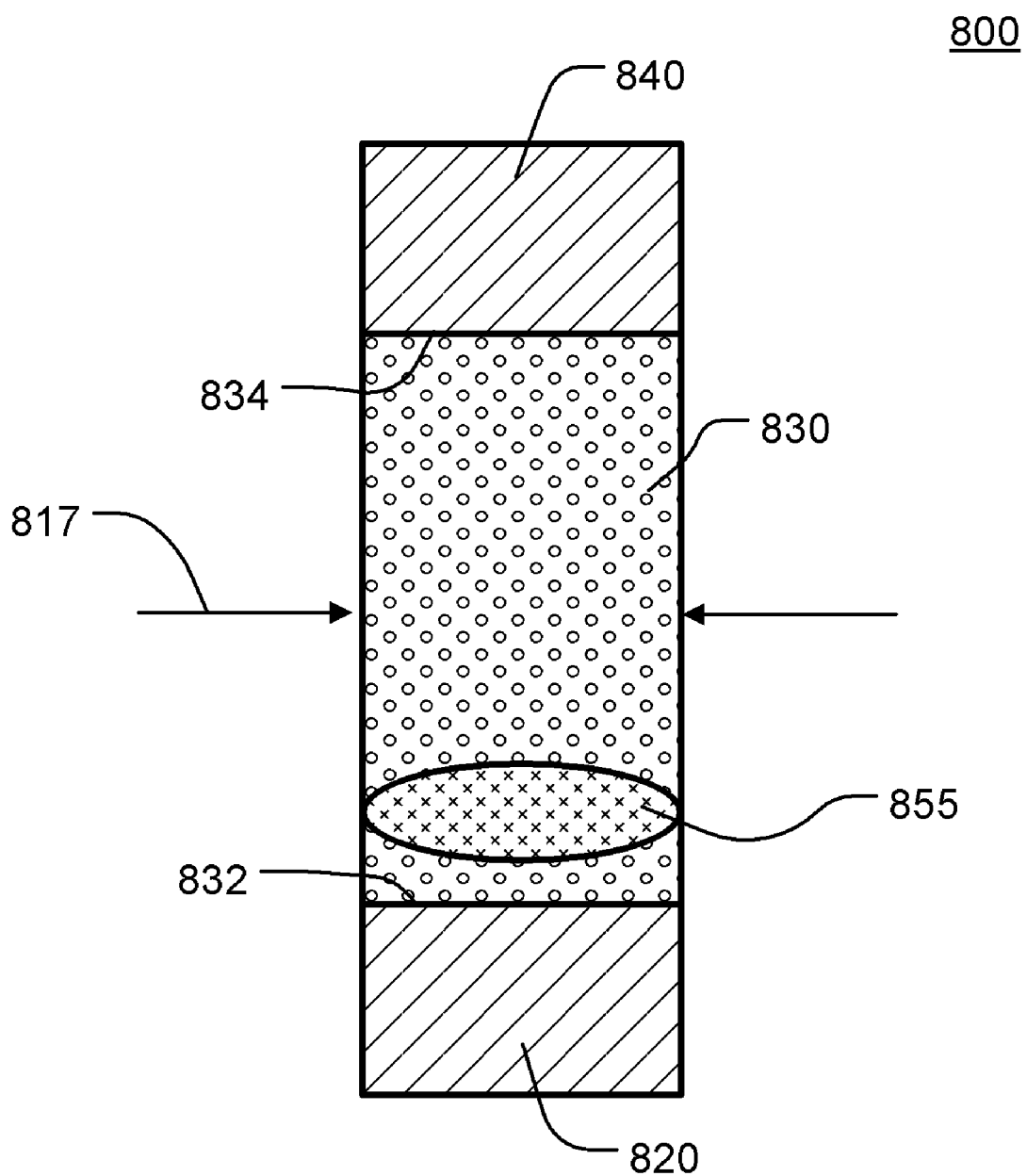
FIG. 8 illustrates a cross-sectional view of a third memory cell having an electrically insulating layer within a body of memory material in the programmed state.
Figure 9:
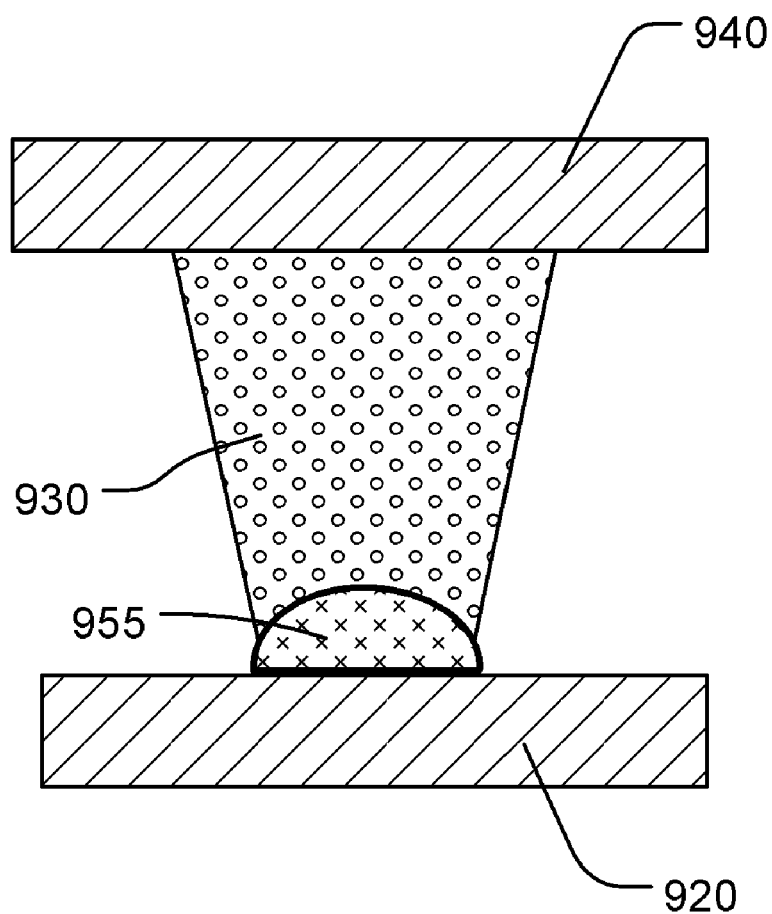
FIG. 9 illustrates a cross-sectional view of a fourth memory cell having an electrically insulating layer within a body of memory material in the programmed state

FIGS. 7-9 illustrate additional examples of memory cells programmed and erased as described herein by the segregation and re-absorption of an electrically insulating layer within a body of memory material. The materials described above with reference to the elements of FIGS. 3A-3B may be implemented in the memory cells of FIGS. 7-9 and thus a detailed description of these materials is not repeated.

FIG. 7 illustrates a top view of a second memory cell 700 having an electrically insulating layer 755 within a body of memory material 730 in the programmed state. As shown the bulk memory material 730 has an asymmetric shape relative to the contact surfaces of the first and second electrodes 720, 740, facilitating the asymmetric segregation/re-absorption processes described herein.

The memory cell 700 includes a dielectric spacer 715 separating first and second electrodes 720, 740. Memory element 730 extends across the dielectric spacer 715 to contact the first and second electrodes 720, 740, thereby defining an inter-electrode current path between the first and second electrodes 720, 740 having a path length defined by the width 717 of the dielectric spacer 715. In a program operation, as current passes between the first and second electrodes 720, 740 and through the memory element 730, the electrically insulating layer 355 is formed closer to the first electrode 720 and consisting of doping materials and/or voids.

FIG. 8 illustrates a cross-sectional view of a third memory cell 800 having an electrically insulating layer 855 within a body of memory material 830 in the programmed state.

The memory cell 800 includes a pillar shaped memory element 830 contacting first and second electrodes 820, 840 at top and bottom surfaces 832, 834 respectively. The memory element 830 has a width 817 substantially the same as that of the first and second electrodes 820, 840 to define a multi-layer pillar surrounded by dielectric (not shown). As used herein, the term "substantially" is intended to accommodate manufacturing tolerances. In a program operation, as current passes between the first and second electrodes 820, 840 and through the memory element 830, doping materials and/or voids segregate within the memory element 830 to form the electrically insulating layer 855. The cell of FIG. 8 has symmetrical top and bottom electrodes, in terms of the area of the contact interfaces with the memory material 830. The formation of the electrically insulating layer 855 and the re-absorption of the materials in the electrically insulating layer 855 for program and erase, respectively, might be induced using different pulse shapes and durations, without changing polarity of the pulses for some combinations of materials.

FIG. 9 illustrates a cross-sectional view of a fourth memory cell 900 having an electrically insulating layer 955 within a body of memory material 930 in the programmed state. The memory element 930 has a width less than that of the first and second electrodes. In a program operation, as current passes between the first and second electrodes 920, 940 and through the memory element 930, doping materials and/or voids segregate within the memory element 930 to form the electrically insulating layer 955.

As will be understood, the memory devices are not limited to the memory cell structures described herein, and generally includes memory cells programmed and erased by the segregation and re-absorption of an electrically insulating layer within a body of memory material.

FIG. 10 is a simplified block diagram of an integrated circuit 1010 including a memory array 1012 implemented using memory cells based on electrical insulating layer segregation and re-absorption, as described herein. A word line decoder 1014 having read, set and reset modes is coupled to and in electrical communication with a plurality of word lines 1016 arranged along rows in the memory array 1012. A bit line (column) decoder 1018 is in electrical communication with a plurality of bit lines 1020 arranged along columns in the array 1012 for reading, setting, and resetting the phase change memory cells (not shown) in array 1012. Addresses are supplied on bus 1022 to word line decoder and drivers 1014 and bit line decoder 1018. Sense circuitry (Sense amplifiers) and data-in structures in block 1024, including voltage and/or current sources for the read, program, and erase modes are coupled to bit line decoder 1018 via data bus 1026. Data is supplied via a data-in line 1028 from input/output ports on integrated circuit 1010, or from other data sources internal or external to integrated circuit 1010, to data-in structures in block 1024. Other circuitry 1030 may be included on integrated circuit 1010, such as a general purpose processor or special purpose application circuitry, or a combination of modules providing system-on-a-chip functionality supported by array 1012. Data is supplied via a data-out line 1032 from the sense amplifiers in block 1024 to input/output ports on integrated circuit 1010, or to other data destinations internal or external to integrated circuit 1010.

A controller 1034 implemented in this example, using a bias arrangement state machine, controls the application of bias circuitry voltage and current sources 1036 for the application of bias arrangements including read, program, erase, erase verify and program verify voltages and/or currents for the word lines and bit lines. Controller 1034 may be implemented using special-purpose logic circuitry as known in the art. In alternative embodiments, controller 1034 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1034.

Figure 11:
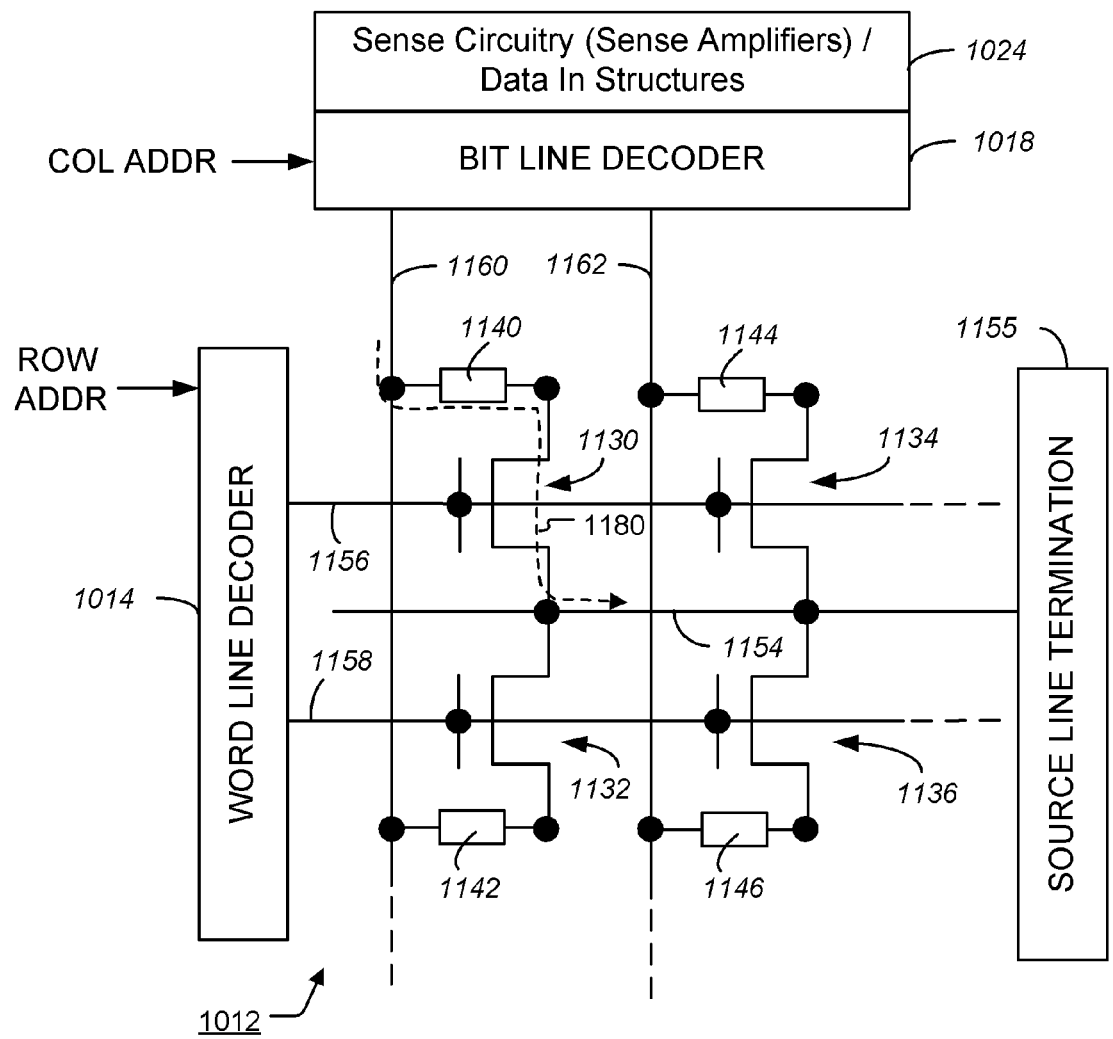
FIG. 11 is a simplified circuit diagram of an embodiment of the memory array of FIG. 10.

As shown in FIG. 11, each of the memory cells of array 1012 includes an access transistor (or other access device) and memory element having an active region comprising electrical insulating layer segregation materials as described herein. In FIG. 11, four memory cells 1130, 1132, 1134, 1136 having respective memory elements 1140, 1142, 1144, 1146 are illustrated, representing a small section of an array that can include millions of memory cells.

Sources of each of the access transistors of memory cells 1130, 1132, 1134, 1136 are connected in common to source line 1154 that terminates in a source line termination circuit 1155. In another embodiment the source lines of the access devices are not electrically connected, but independently controllable. The source line termination circuit 1155 may include bias circuitry such as voltage sources and current sources, and decoding circuits for applying bias arrangements, other than ground, to the source line 1154 in some embodiments.

A plurality of word lines including word lines 1156, 1158 extend in parallel along a first direction. Word lines 1156, 1158 are in electrical communication with word line decoder 1014. The gates of access transistors of memory cells 1130 and 1134 are connected to word line 1156, and the gates of access transistors of memory cells 1132 and 1136 are connected in common to word line 1158.

A plurality of bit lines including bit lines 11160, 1162 extend in parallel in a second direction and are in electrical communication with bit line decoder 1018. In the illustrated embodiment each of the memory elements are arranged between the drain of the corresponding access device and the corresponding bit line. Alternatively, the memory elements may be on the source side of the corresponding access device.

It will be understood that the memory array 1012 is not limited to the array configuration illustrated in FIG. 11, and additional array configurations can also be used. Additionally, instead of MOS transistors, bipolar transistors or diodes may be used as access devices in some embodiments.

In operation each of the memory cells in the array 1012 store data depending upon the resistance of the corresponding memory element. The data value may be determined, for example, by comparison of current on a bit line for a selected memory cell to that of a suitable reference current by sense amplifiers of sense circuitry 1024. The reference current can be established to that a predetermined range of currents correspond to a logical "0", and a differing range of current correspond to a logical "1".

Reading or writing to a memory cell of array 1012, therefore, can be achieved by applying a suitable voltage to one of word lines 1158, 1156, coupling one of bit lines 1160, 1162 to a voltage source, and floating or coupling unselected bit lines to another voltage source, and coupling the source line 1154 to a voltage source, so that current flows through the selected memory cell. For example, a current path 1180 through a selected memory cell (in this example memory cell 1130 and corresponding memory element 1140) is established by floating the unselected bit line 1162, applying voltages to the selected bit line 1160, selected word line 1156, and source line 1154 sufficient to turn on the access transistor of memory cell 1130 and induce current in path 1180 to flow from the bit line 1160 to the source line 1154, or vice-versa. The level and duration of the voltages applied is dependent upon the operation performed, e.g. a reading operation, program operation, or erase operation.

In a read (or sense) operation of the data value stored in the memory cell 1130, word line decoder 1014 facilitates providing word line 1156 with a suitable voltage pulse to turn on the access transistor of the memory cell 1130. Bit line decoder 1018 facilitates supplying a voltage to bit line 1160 of suitable amplitude and duration, and floating the unselected bit line 1162. This read operation will induce current to flow through the memory element 1140 that does not result in the memory element undergoing a change in resistive state. The current on the bit line 1160 and through the memory cell 1130 is dependent upon the resistance of, and therefore the data state associated with, the memory cell 1130. Thus, the data state of the memory cell 1130 may be determined by detecting whether the resistance of the memory cell 1130 corresponds to the high resistance state or the low resistance state (and optionally one of a plurality of intermediate resistance states), for example by comparison of the current on bit line 1160 with a suitable reference current or currents by sense amplifiers of sense circuitry 1024.

Figure 12:
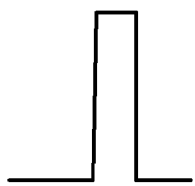
FIGS. 12-15 illustrate possible pulse shapes for programming and erasing.
Figure 13:
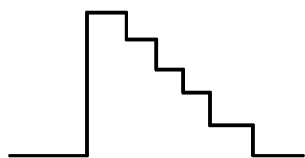
Figure 14:
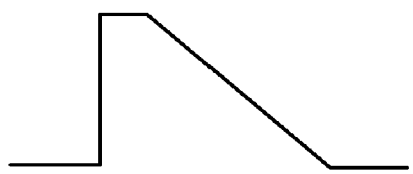
Figure 15:
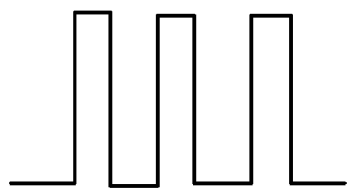

FIGS. 12-15 show examples of various pulse shapes which can utilize in the programming operations which cause formation of the electrically insulating layer. As shown in FIG. 12, a single voltage pulse could be applied to cause the segregation of the electrically insulating layer from the bulk memory material. Likewise, the voltage pulse can have a steep leading-edge followed by a stepped trailing edge as shown in FIG. 13. Voltage pulse can have a steep leading-edge followed by a ramped trailing edge as shown in FIG. 14. As shown in FIG. 15, a sequence of pulses can be utilized, where each pulse can be shaped as a rectangle, a stepped pulse or a ramped pulse.

The pulse shapes shown in FIGS. 12-15 can also be utilized for the erasing operations which cause re-absorption of the blocking insulating layer.

It will be appreciated that the pulse shapes for programming and erasing can be empirically designed to provide the results desired. Note that in this specification use the term "programming" for causing formation of the high impedance state, and the term "erasing" for causing formation of the low impedance state. Materials as described herein are also suitable for multilevel data storage. The "erasing" process described here might be more appropriately referred to as "programming" in a single level programming cell, depending on the particular implementations of the memory devices this technology.

FIGS. 16-19 illustrate the experimental setup utilized in testing a device which was photographed as shown in FIG. 4, and in which the memory material comprises $Ge_2Sb_2Te_5$ doped with 15 atomic percent silicon oxide.

Figure 16:
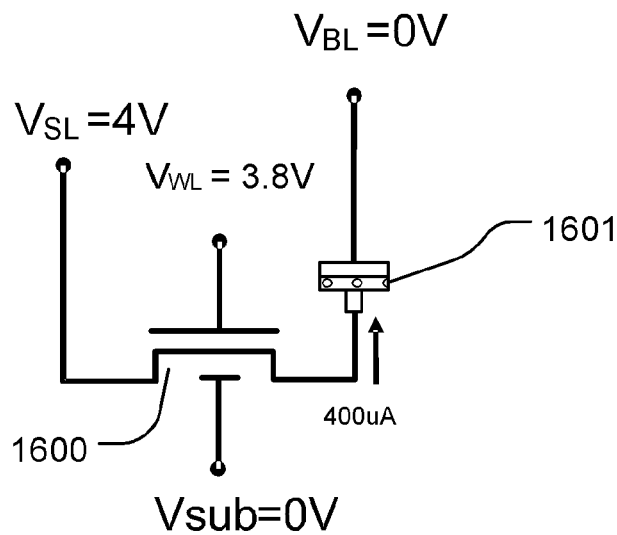
FIG. 16 illustrates a biasing arrangement for a programming operation to induce formation of an electrically insulating layer.
Figure 17:
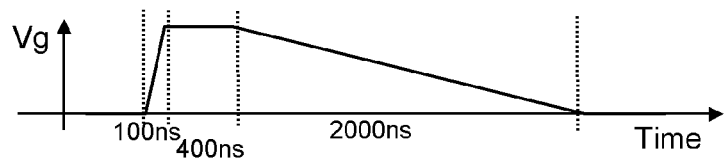
FIG. 17 shows a pulse shape for a word line voltage in the programming operation of FIG. 16.

As shown in FIG. 16, a pulse with a peak magnitude of 4 volts is applied between the source line (acting as the anode) and to the bit line (acting as the cathode). An access transistor 1600 was coupled between the source line and the memory cell 1601. The substrate was biased at zero volts, while the word line for the selected cell received a peak voltage of about 3.8 volts. As shown in FIG. 17, the shape of the pulse applied to the word line used to induce the high impedance state had a leading-edge ramped upward in 100 nanoseconds to a maximum voltage which was maintained constant for 300 nanoseconds. The voltage of the pulse then ramped to zero volts from the maximum in 2000 nanoseconds. The measured maximum pulse current was about 400 microamps.

Figure 18:
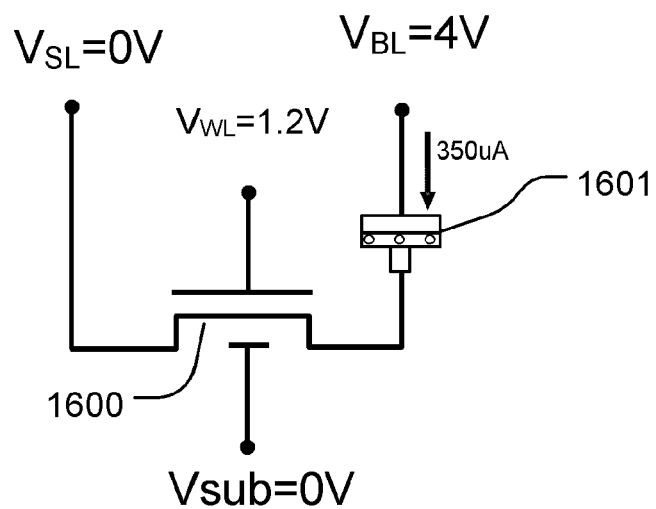
FIG. 18 illustrates a biasing arrangement for an erasing operation to induce re-absorption of the electrically insulating layer.
Figure 19:
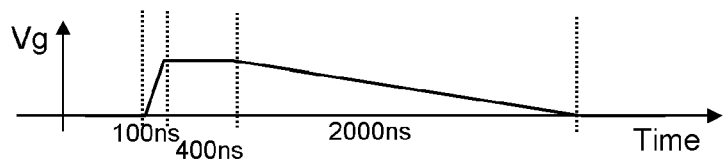
FIG. 19 shows a pulse shape for a word line voltage in the erasing operation of FIG. 18.

As shown in FIG. 18, an opposite polarity was applied to induce the low resistance state, where the bit line received a positive voltage (acting as the anode) and the source line received zero volts (acting as the cathode). The word line in this embodiment received a voltage of about 1.2 volts while the substrate was grounded. As shown in FIG. 19, the pulse shape applied to the word line for the erased a low resistance operation included a leading-edge which wrapped to a maximum voltage over about 100 nanoseconds, remained constant for about 400 nanoseconds, and ramped to 0 over about 2000 nanoseconds. The maximum measured pulse current was about 350 microamps in this operation to induce re-absorption of the blocking insulating layer into the bulk memory material. Opposite polarity pulse for this configuration memory cell is believed to facilitate the dielectric breakdown of the electrically insulating layer under the electric field of the pulse applied, followed by electromigration and or other kinetic processes that cause the electrically insulating materials to be reabsorbed into the bulk memory material.

Figure 20:
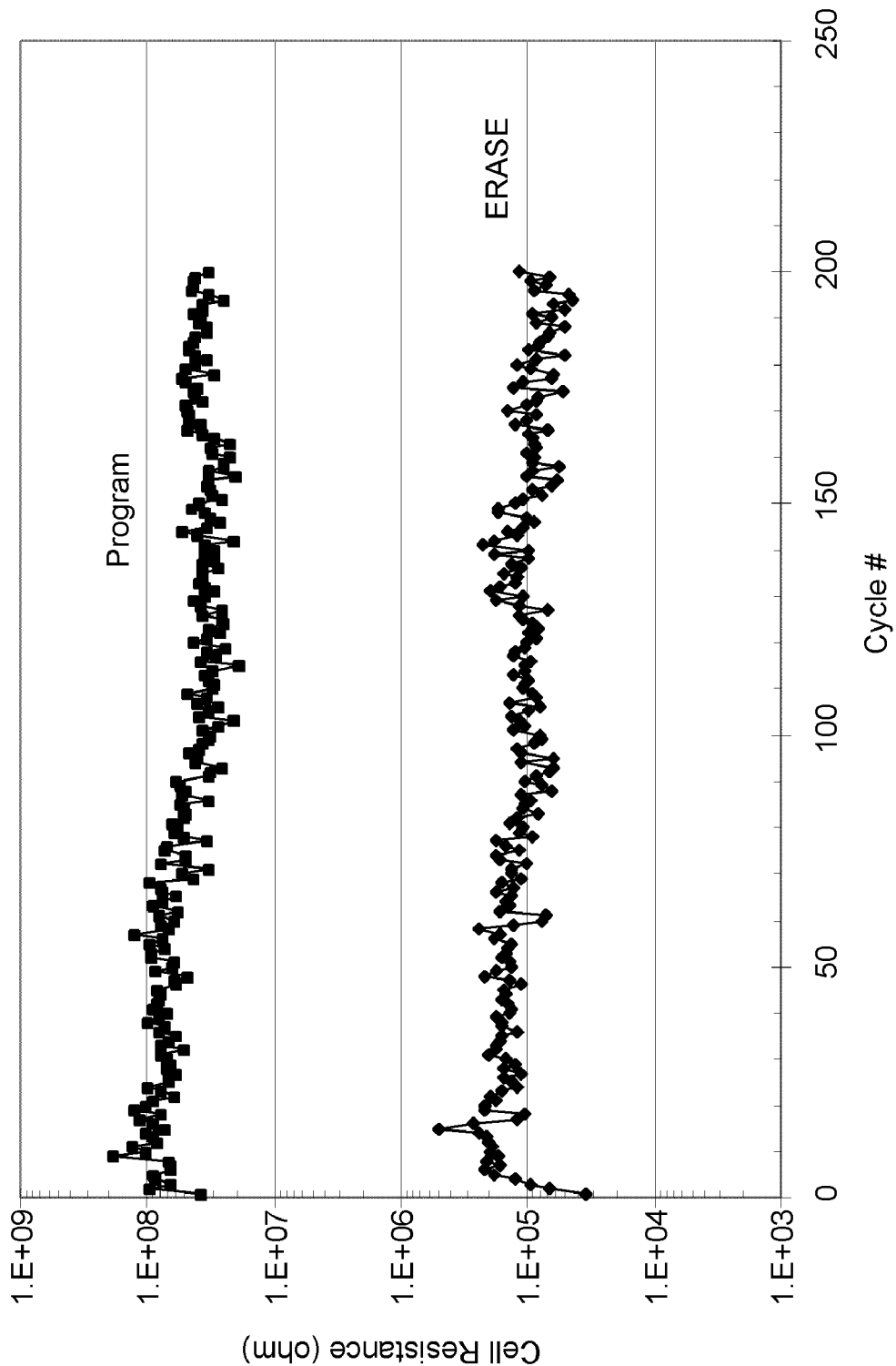
FIG. 20 is a graph of measured cell resistance versus cycle number for program/erase cycling.

FIG. 20 illustrates the cycling results for programming and erasing the memory cell using the setup of FIGS. 16-19. As can be seen, over 200 cycles the ratio of cell resistance in the programmed state to in the erases state is reliably over 2 to 3 orders of magnitude.

Figure 21:
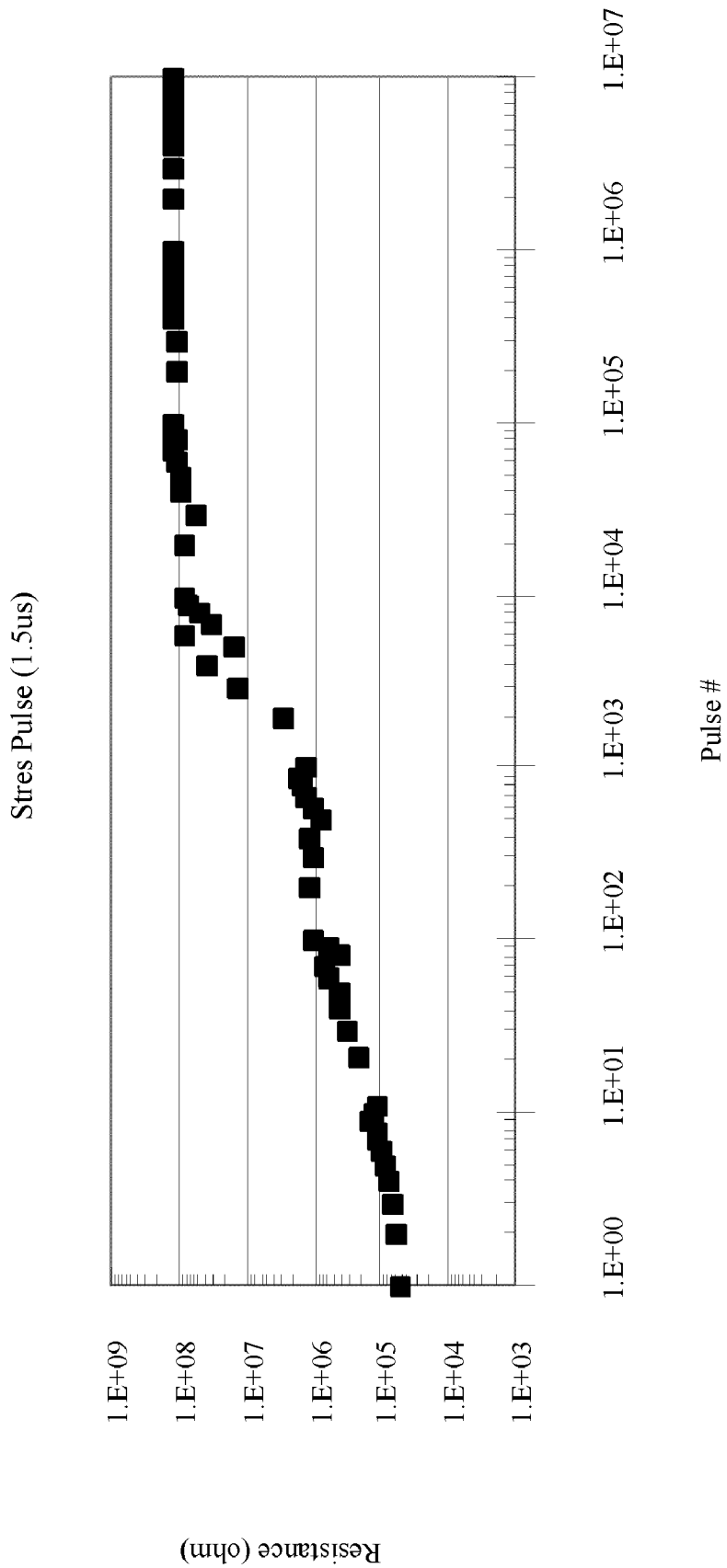
FIG. 21 is a graph of measured cell resistance versus pulse number for a programming bias suitable for multilevel programming.

FIG. 21 illustrates the change in resistance from the low resistance state at about 50 K ohms to the high resistance state of about 100 M ohms versus pulse count, by applying a sequence of lower energy pulses to enable multilevel programming operations. The lower energy pulses used to obtain the data of FIG. 21 includes setting the source line to 3.5 Volts, rather than the 4 Volts used for the single pulse embodiment shown in FIG. 16. Also, the word line pulse had a 200 nanosecond leading-edge, followed by a 300 nanosecond constant maximum level, followed by 1000 nanosecond trailing edge. The lower energy program pulse used to obtain the data of FIG. 21 thus generates the void/vacancy structure which forms the electrically insulating layer more gradually than does the single pulse higher energy embodiments described above. Thus the resistance of the programmed state increases gradually when the total programming energy is controlled by applying the sequence of lower energy pulses. As shown in FIG. 21, the cell resistance increases gradually with pulse number, using the representative pulse shape described above.

The kinetic memory mechanism has been demonstrated herein for a memory device having a body of memory material comprising silicon oxide doped $Ge_xSb_yTe_z$, where x=2, y=2 and z=5, doped with 10 to 20 atomic % silicon oxide. However, since the memory mechanism described herein does not rely on changes in the solid phase conditions in the memory material, other materials which are characterized by segregation and re-absorption kinetic processes of an electrically insulating layer as a result of the application of programming and erasing bias arrangements may be utilized. For example, the bulk memory material may consist of one or more elements including Sb, Te, Sn, Pb, Bi, Al, Ge—Te, Ge—Sb_Te, or Ag—In—Sb—Te, and so on. The vacancies that result in void formation in the electrically insulating layer may come from material density changes during manufacturing processes, or after applying the operating current. A gas type dopant (e.g. $N_2$, Ar, etc.) may provide vacancies suitable for the process of forming the electrically insulating layer. A dielectric dopant can be silicon oxide, silicon nitride, silicon-oxynitride, aluminum oxide or other materials chosen for compatibility with the bulk memory material. Embodiments of the memory material can have a melting temperature of less than 800 degrees to save operation power. However, other higher melting point materials could also be utilized.

Such material density/volume change may result from changing the alloy grain size, phase change from amorphous to crystalline, material segregation, or other kinetic processes within the bulk memory material. GST material is a semiconductor with a narrow band gap, so that electrons can easily be removed from the valence band and leave positively charged ionized atoms or molecules. Under operating conditions near or above the melting temperature, electromigration or other interaction between an electric field and ionized atoms or molecules can cause movement of the materials along the electric field. Similar kinetic mechanisms which depend on the polarity of the electric field, temperature gradients, and/or current density distribution, can be relied upon for causing the segregation and re-absorption of the electrically insulating layer as described herein.

The memory cell starts from a low resistance "erased" state. When applying one or several electric current pulses through the memory layer, the memory material will be heated up by the current. By controlling the heating procedure, many electrical/thermal induced kinetic effects may happen, including electromigration and the phase segregation of different materials. A dielectric and/or void mixture will be formed along an inter-electrode current path between electrodes to block current flow, for example being formed adjacent a contact surface, so that the cell is programmed to high resistance "programmed state".

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
a memory cell comprising a first electrode and a second electrode, and a body of memory material between the first and second electrodes; and
circuitry to apply bias arrangements to the memory cell, the bias arrangements including:
a first bias arrangement to establish a high resistance state by inducing segregation of an electrically insulating layer out of the body of memory material; and
a second bias arrangement to establish a low resistance state by inducing re-absorption of at least a portion of the electrically insulating layer into the body of memory material.

2. The memory device of claim 1, wherein said segregation is due to movement of material of the electrically insulating layer from regions of lower current density within the body of memory material to regions of higher current density.

3. The memory device of claim 1, wherein said segregation is due to movement of material of the electrically insulating layer from regions of lower temperature within the body of memory material to regions of higher temperature.

4. The memory device of claim 1, wherein said segregation is due to movement of material of the electrically insulating layer from regions of lower voltage potential within the body of memory material to regions of higher voltage potential.

5. The memory device of claim 1, wherein the electrically insulating layer comprises one or more voids.

6. The memory device of claim 1, wherein:
the body of memory material comprises a bulk material and a doping material;
the first bias arrangement induces segregation of the doping material from the bulk material to form the electrically insulating layer of the doping material; and
the second bias arrangement induces re-absorption of the doping material into the bulk material.

7. The memory device of claim 6, wherein:
the bulk material comprises a material selected from a group consisting of metals, semiconductors, and combinations thereof; and
the doping material comprises a material selected from a group consisting of dielectrics, gasses, and combinations thereof.

8. The memory device of claim 6, wherein the bulk material comprises a chalcogenide material, and the doping material comprises a dielectric material.

9. The memory device of claim 8, wherein the dielectric material comprises silicon oxide with a concentration in a range of 10 to 20 at %.

10. The memory device of claim 1, wherein:
the first and second electrodes contact the body of memory material at respective contact surfaces, the contact surface of the first electrode having a surface area less than that of the contact surface of the second electrode; and
the electrically insulating layer is closer to the first contact surface than the second contact surface.

11. The memory device of claim 1, wherein the first bias arrangement and the second bias arrangement have opposite voltage polarity from the first electrode to the second electrode.

12. The memory device of claim 1, wherein the bias arrangements further include a third bias arrangement to establish a resistance state between the high and low resistance states.

13. The memory device of claim 1, wherein a ratio of resistance of the body of memory material in the high resistance to the low resistance state is greater than 1000.

14. A method for operating a memory device comprising a memory cell comprising a first electrode and a second electrode, and a body of memory material between the first and second electrodes, the method comprising:
applying a first bias arrangement to establish a high resistance state by inducing segregation of an electrically insulating layer out of the body of memory material; and
applying a second bias arrangement to establish a low resistance state by inducing re-absorption of at least a portion of the electrically insulating layer into the body of memory material.

15. The method of claim 14, wherein said segregation is due to movement of material of the electrically insulating layer from regions of lower current density within the body of memory material to regions of higher current density.

16. The method of claim 14, wherein said segregation is due to movement of material of the electrically insulating layer from regions of lower temperature within the body of memory material to regions of higher temperature.

17. The method of claim 14, wherein said segregation is due to movement of material of the electrically insulating layer from regions of lower voltage potential within the body of memory material to regions of higher voltage potential.

18. The method of claim 14, wherein the electrically insulating layer comprises one or more voids.

19. The method of claim 14, wherein:
the body of memory material comprises a bulk material and a doping material;
the first bias arrangement induces segregation of the doping material from the bulk material to form the electrically insulating layer of the doping material; and
the second bias arrangement induces re-absorption of the doping material into the bulk material.

20. The method of claim 19, wherein:
the bulk material comprises a material selected from a group consisting of metals, semiconductors, and combinations thereof; and
the doping material comprises a material selected from a group consisting of dielectrics, gasses, and combinations thereof.

21. The method of claim 19, wherein the bulk material comprises a chalcogenide material, and the doping material comprises a dielectric material.

22. The method of claim 21, wherein the dielectric material comprises silicon oxide with a concentration in a range of 10 to 20 at %.

23. The method of claim 14, wherein:
the first and second electrodes contact the body of memory material at respective contact surfaces, the contact surface of the first electrode having a surface area less than that of the contact surface of the second electrode; and
the electrically insulating layer is closer to the first contact surface than the second contact surface.

24. The method of claim 14, wherein the first bias arrangement and the second bias arrangement have opposite voltage polarity from the first electrode to the second electrode.

25. The method of claim 14, further comprising applying a third bias arrangement to establish a resistance state between the high and low resistance states.

26. The method of claim 14, wherein a ratio of resistance of the body material in the high resistance to low resistance state is greater than 1000.

* * * * *